(12) United States Patent
Canham et al.

(10) Patent No.: US 8,904,630 B2
(45) Date of Patent: Dec. 9, 2014

(54) METHOD OF PLACING A CHIP ASSEMBLY IN A SOCKET HOUSING

(75) Inventors: Rick Canham, Portland, OR (US); Tozer Bandorawalla, Portland, OR (US); Alan McAllister, Portland, OR (US); Kelly Eakins, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 464 days.

(21) Appl. No.: 13/407,246

(22) Filed: Feb. 28, 2012

(65) Prior Publication Data

US 2012/0151762 A1   Jun. 21, 2012

Related U.S. Application Data

(62) Division of application No. 12/346,997, filed on Dec. 31, 2008, now Pat. No. 8,151,450.

(51) Int. Cl.
*H05K 3/30* (2006.01)
*H05K 7/10* (2006.01)

(52) U.S. Cl.
CPC .................................. *H05K 7/1061* (2013.01)
USPC .................................. 29/832; 29/837; 29/840

(58) Field of Classification Search
USPC ............................................ 29/832, 837, 840
See application file for complete search history.

(56) References Cited

U.S. PATENT DOCUMENTS

| | | | | |
|---|---|---|---|---|
| 4,304,514 A | * | 12/1981 | Pfaff | 29/741 |
| 4,439,917 A | * | 4/1984 | Pearson | 29/825 |
| 4,567,652 A | * | 2/1986 | Gussman et al. | 29/837 |
| 4,584,764 A | * | 4/1986 | Gussman | 29/705 |
| 4,817,273 A | * | 4/1989 | Lape et al. | 29/741 |
| 5,842,272 A | * | 12/1998 | Nuxoll | 29/739 |

* cited by examiner

*Primary Examiner* — Carl Arbes
(74) *Attorney, Agent, or Firm* — Kevin A. Reif

(57) ABSTRACT

A land grid array (LGA) socket uses a series of inclined engagement features to transfer a lateral load into a normal load to retain the LGA package in the socket. The number and position of the engagement features along the side of the socket permits a more uniform transfer of load to the solder ball array as compared to current mechanisms.

6 Claims, 6 Drawing Sheets

METHOD OF PLACING A CHIP ASSEMBLY IN A SOCKET HOUSING

The present application is a divisional of and claims the benefit of earlier filed U.S. patent application Ser. No. 12/346,997, filed on Dec. 31, 2008, titled: SLIDING PACKAGE RETENTION DEVICE FOR LGA SOCKETS, which is incorporated by reference herein.

FIELD OF THE INVENTION

Embodiments of the present invention are directed to retention packages and, more particularly, to a sliding retention package for a land grid array (LGA) socket.

BACKGROUND INFORMATION

Semiconductor manufacturers currently employ two primary technologies for central processing unit (CPU) packages. The first is referred to as pin grid array (PGA) sockets and the second is commonly referred to as land grid array (LGA) sockets.

PGA packages typically have a greater assembly and material cost due to the pins. In addition, there are limitations on the pin pitch and number of pins that can realistically be manufactured.

LGA packages may be less costly since there may be no holes, rather, pins on the LGA touch contact points on the underside of the CPU and are retained in the socket by either an integral loading scheme such as the direct socket loading (DSL) for socket T or an independent loading mechanism (ILM) with a back plate as adopted for socket B. Socket T and Socket B refer to two types of currently used socket variations.

Unfortunately, the DSL mechanism may result in solder joint reliability issues in various shock, vibration and power cycle conditions. In addition, it may pose challenges with scalability to accommodate larger numbers of contacts and may not easily lend itself to low profile designs.

The ILM, on the other hand, utilizes a back plate which may render it less desirable in system designs that have minimal clearance between the back of the board and the chassis. Another disadvantage of the ILM design is that it is an additional part that adds to the total cost of the system.

Thus, semiconductor manufacturers are constantly striving to find affordable new ways to secure a CPU reliably in a confined area.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Described is an LGA package design intended to overcome the above short comings. It uses a series of inclined engagement features to transfer a lateral load into a normal load to retain the LGA package in the socket. Since embodiments utilize an LGA package, the cost associated with using package pins is eliminated and the limitations of PGA technologies are no longer a concern.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
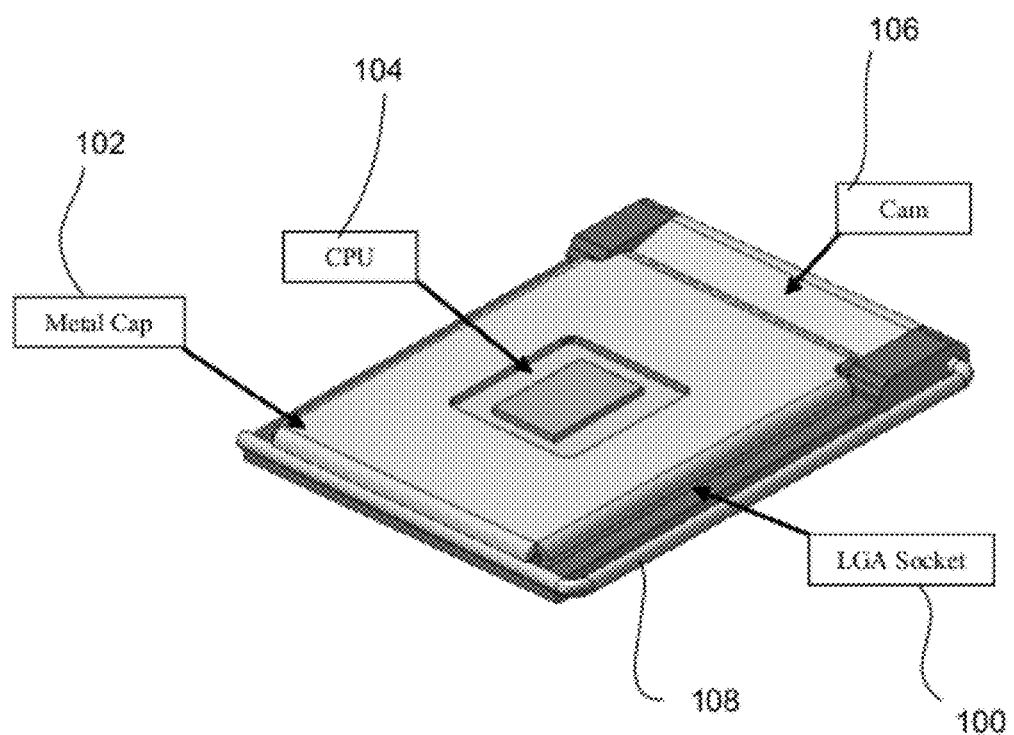
FIG. 1 is a block diagram of a land grid array (LGA) socket according to one embodiment.

Referring now to FIG. 1 there is shown a drawing featuring one embodiment of the inventive LGA package in a closed or locked position. As shown, the package comprises an LGA socket 100 and a metal cap 102 with an opening for a CPU 104. The metal cap 102 is slidably hinged to open and close according to a position of a cam which rotates into an open or locked position according to the position of a lever handle 108. The LGA socket 100 may be made for example with injection molding technologies. The metal cap 102 may be made for example by metal casting or stamping. Details of the design and operation will become more readily apparent with reference to the more detailed figures of drawings.

Like features in the various drawings are typically labeled with like reference numerals and, while shown, may not necessarily be discussed again in the interest of brevity.

Figure 2:
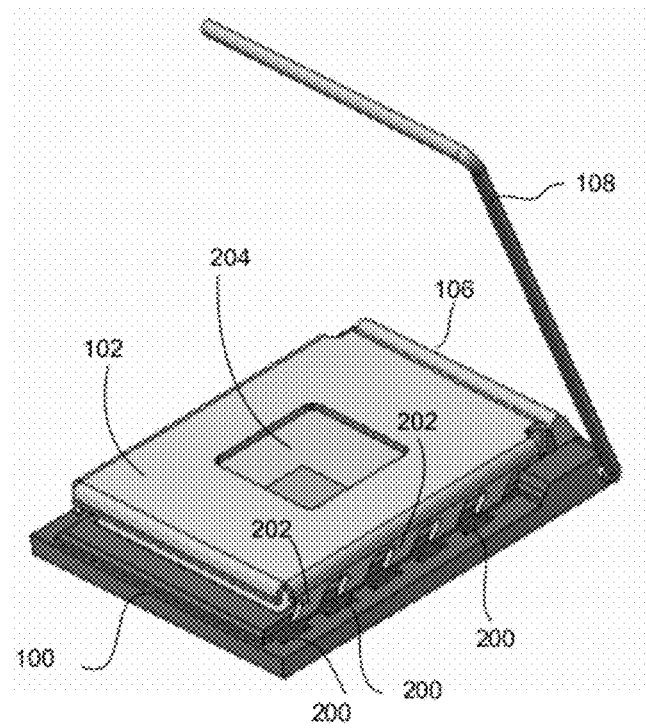
FIG. 2 is a block diagram of the LGA socket while disengaged.

As shown in FIG. 2, the LGA package is in an open position with the lever 108 pulled upwards to rotate the cam 106 thus causing the metal cap 102 to slide in a backwards and elevated direction with relation to the LGA socket 100. The LGA socket 100 has a series of engagement features or slots 200 along the two long edges of the socket housing 100 that function as inclined planes. The socket cap 102 has mating engagement features or teeth 202, which slide down the slots 200 as the cam 106 at the back side of the socket is engaged. The cam 106 applies a lateral force, which is converted to a normal force by the inclined engagement features 200 and 202. The vertical force applied to the top of the package creates a pressure great enough to maintain a solid electrical connection. The socket cap 102 may be a solid plate with a cut out 204 for a package die so that the enabling load is distributed as evenly as possible.

Figure 3A:
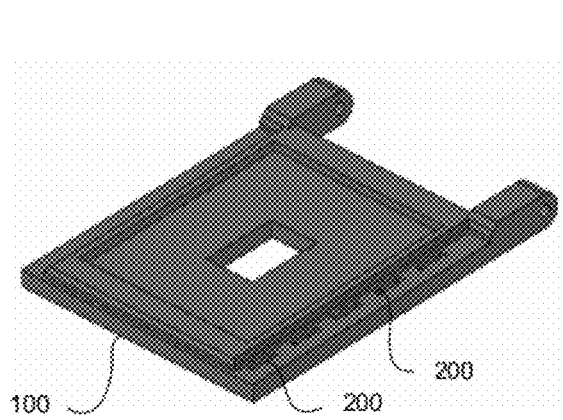
FIG. 3A is a top view of the LGA housing according to one embodiment.
Figure 3B:
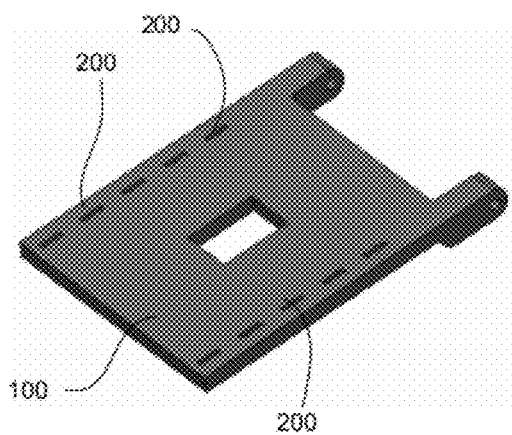
FIG. 3B is a bottom view of the LGA housing.
Figure 4A:
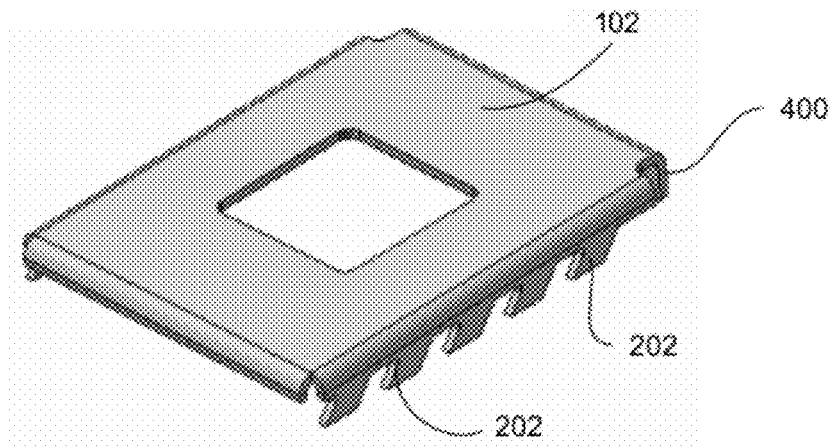
FIG. 4A is a top view of the cap for the LGA housing according to one embodiment.
Figure 4B:
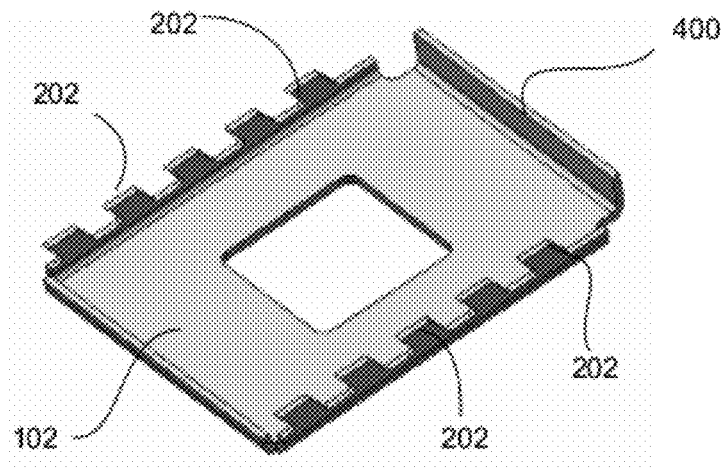
FIG. 4B is a bottom view of the cap for LGA housing shown in FIG. 4A.

FIG. 3A shows a top view of an embodiment of the LGA socket 100 and FIG. 3B shows a bottom view featuring the slots 200 that may run along either side. Similarly, FIG. 4A shows a top view of the metal cap plate 102 and FIG. 4B shows a bottom view featuring the inclined teeth 202 running along either side and adapted to mate with the slots 200 of the socket housing 100.

Figure 5:
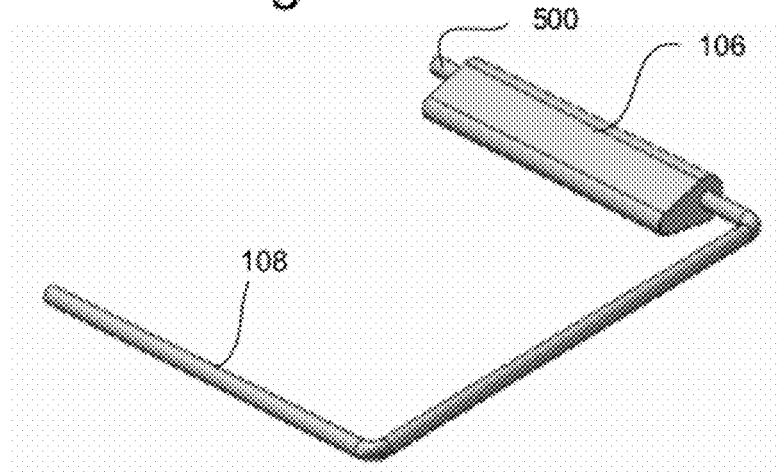
FIG. 5 is a view of the cam and handle assembly according to one embodiment.

FIG. 5 shows a more detailed view of the cam 106 which may be generally wedge shaped with rounded edges. A hinge pin 500 may run through the thicker portion of the cam 106 such that when the handle 108 is rotated upwards the cam pivots about the hinge pin 500 and causes the cam 106 to engage the back portion 400 of the cap 102 to slide the cap back and vertical with relation to the socket housing 100.

Figure 6:
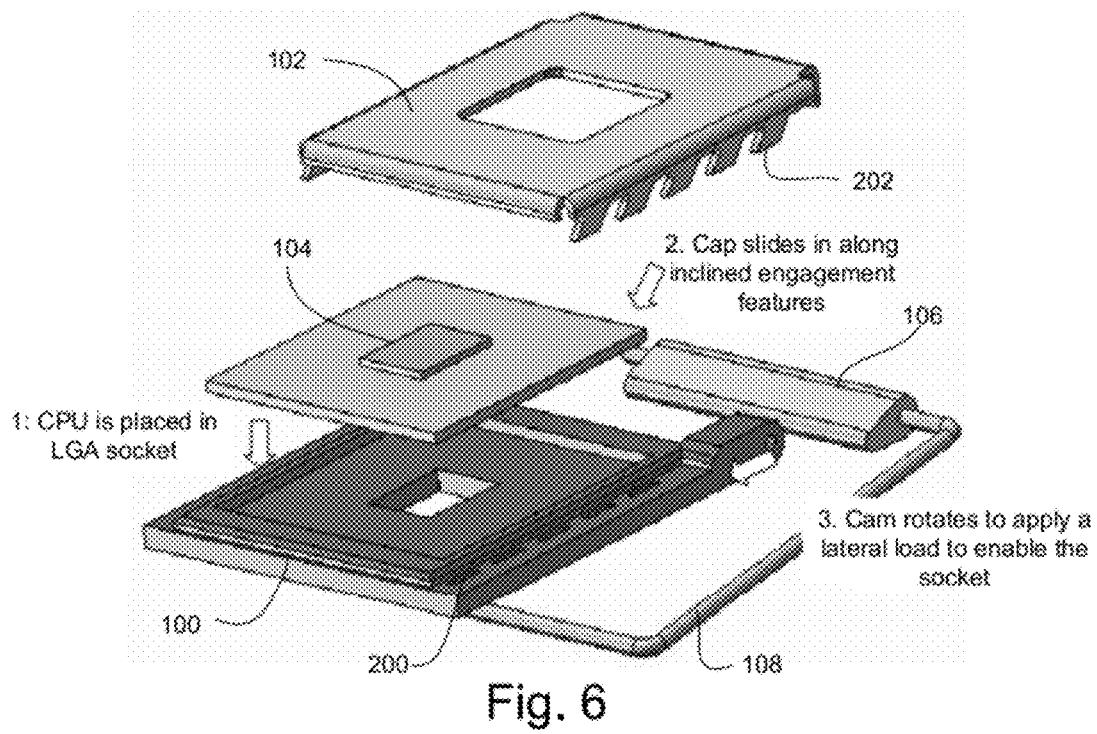
FIG. 6 is an exploded assembly view of the LGA socket.

Referring now to FIG. 6, there is shown an exploded assembly view of one embodiment of the invention illustrating its working features. As shown, a CPU 104 may be placed in the LGA socket 100. When the handle 108 is rotated the cam 106 causes the cap 102 to move and the teeth 202 to slide along the inclined walls defining the interior of the slots 200. As the cam 106 rotates, it causes the cap 102 to apply a lateral load to the CPU 104 assembly to enable the socket.

Figure 7A:
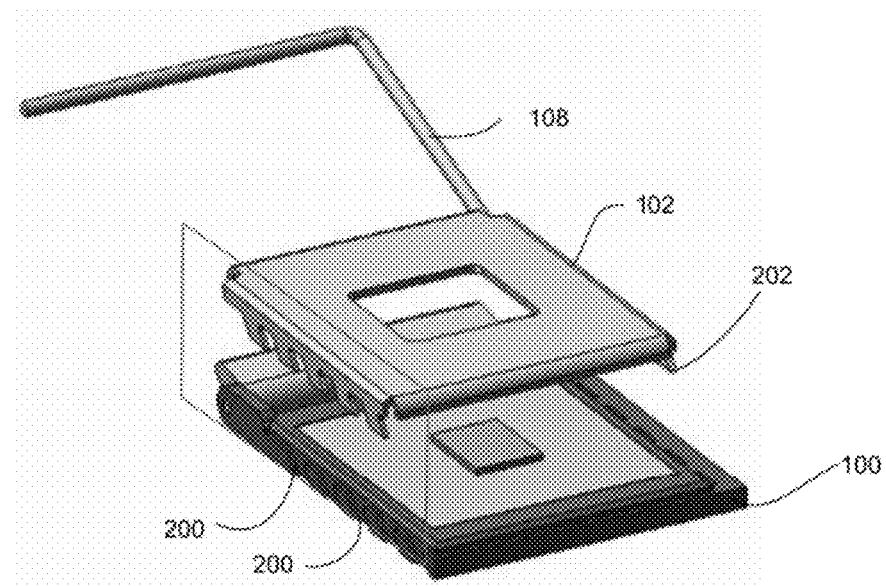
FIGS. 7A, 7B, 7C, 7D, and 7E are cut away sides views of the LGA socket in various stages of engagement.
Figure 7B:
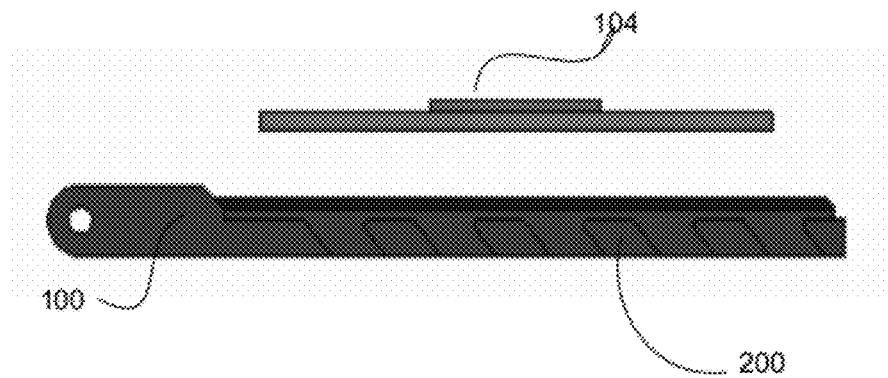
Figure 7C:
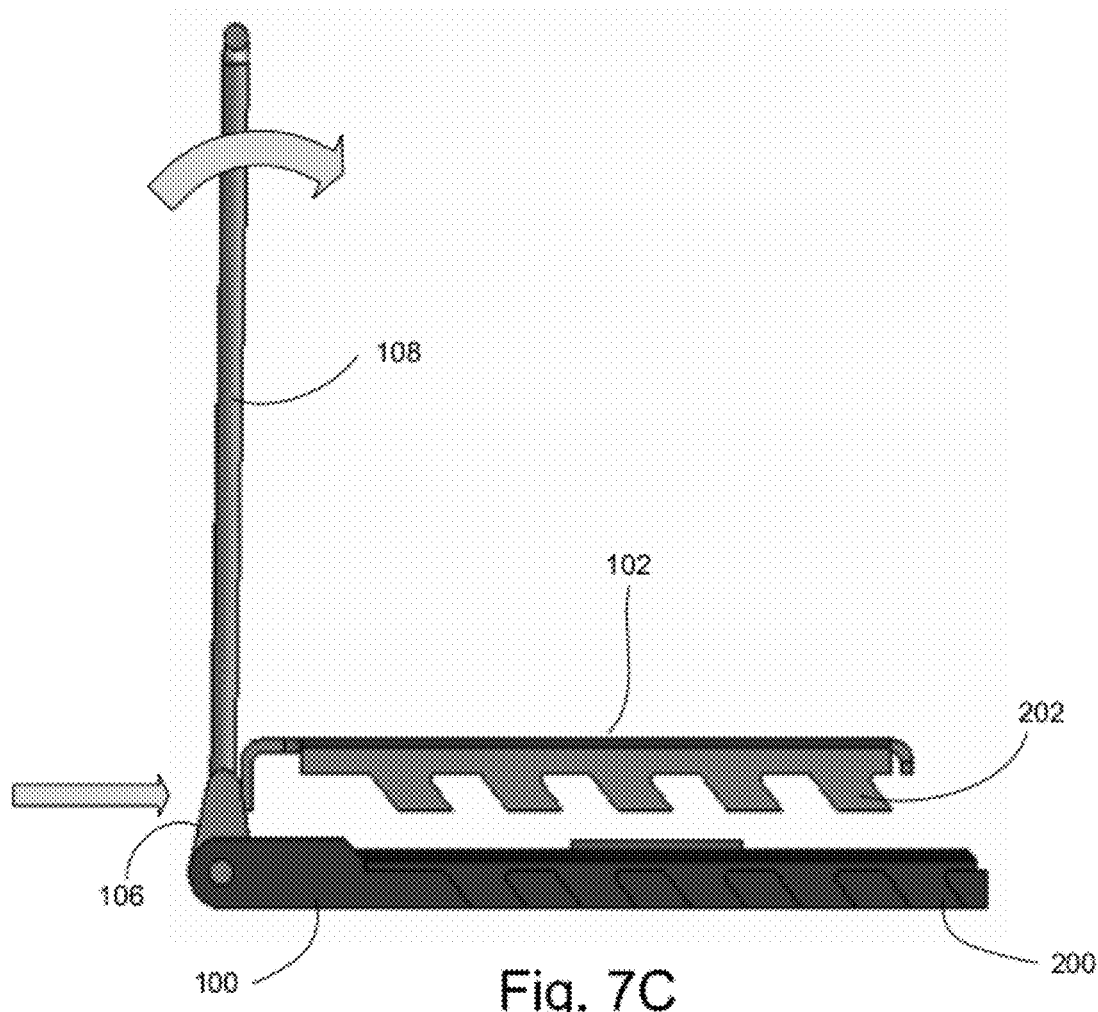
Figure 7D:
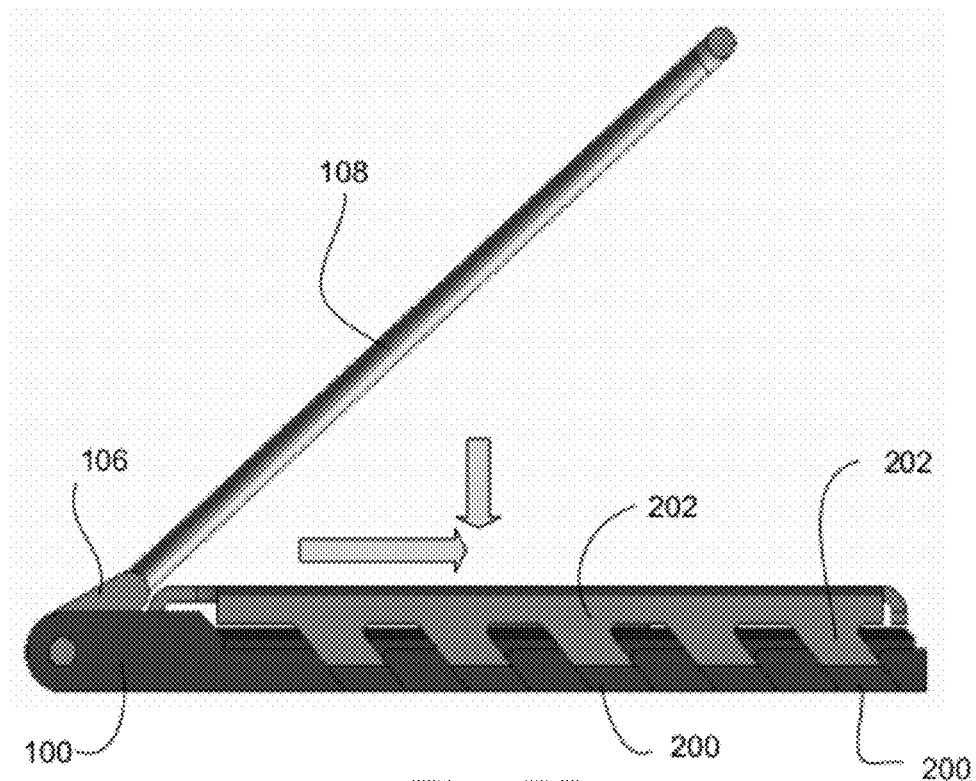
Figure 7E:
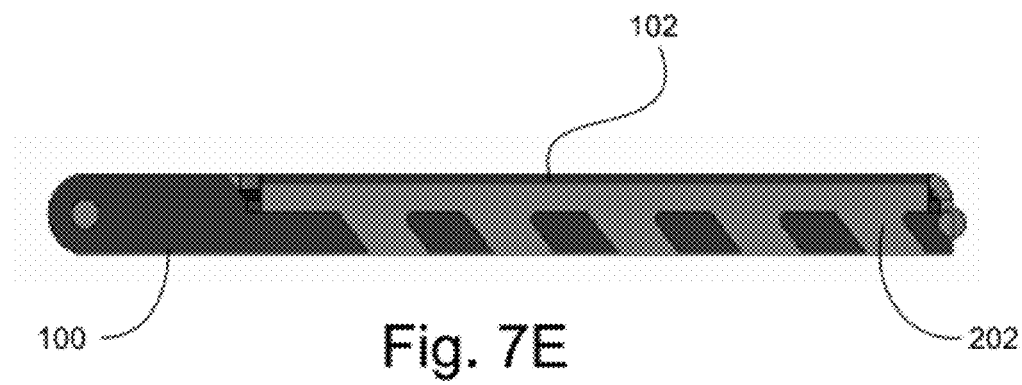

FIGS. 7A, 7B, 7C, 7D and 7E show cutaway views of one embodiment revealing the inclined features within the slots 200. FIG. 7B shows the CPU 104 being inserted into the LGA socket 100. A reactive force from leads tends to push the CPU 104 upwards. As shown in FIG. 7C when the handle 108 is rotated, the cam 106 engages the metal cap 102 to apply a lateral load which slides the cap 102 down with the teeth 202 engaging the slots 200. FIG. 7D shows the shows the teeth 202 engaging the inclined features within the slots 200. The load is transferred from the lateral cam movement to produce a compressive force on the CPU assembly. FIG. 7E shows the socket fully enabled producing a low profile package.

According to embodiments, the number and position of the engagement features along the side of the socket permits a more uniform transfer of load to the solder ball array as compared to current DSL mechanism. Hence, proposed embodiments alleviate reliability concerns of the DSL mechanisms. The design does not require a separate part for package rentention such as an ILM with a back plate and consequently it is amenable to low profile designs with minimal clearance between the back of the board and the chassis.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
   placing a chip assembly is a socket housing;
   providing a plurality of slots running along sides of the socket housing;
   providing inclined planes defining an interior of each of the slots; and
   rotating a cam to put a lateral force of a cap, the cap having a plurality of inclined teeth corresponding to the plurality of slots, wherein the cap puts a downwards pressure on the chip assembly to engage it within the socket.

2. The method as recited in claim 1, further comprising:
   moving a lever to cause the cam to rotate.

3. The method as recited in claim 1 wherein the socket housing is a land grid array (LGA) socket housing.

4. The method as recited in claim 1 wherein the chip assembly comprises a central processing unit (CPU).

5. The method as recited in claim 4, further comprising:
   providing an opening in the cap to expose the CPU.

6. The method as recited in claim 1 further comprising:
   converting the lateral force into a normal force with the inclined planes.

* * * * *